US010557193B2

(12) United States Patent
Liimatainen et al.

(10) Patent No.: US 10,557,193 B2
(45) Date of Patent: Feb. 11, 2020

(54) METHOD FOR MANUFACTURING THIN FILMS BY UTILIZING SHORT LASER PULSES AND COMPOSITE TARGET MATERIALS

(71) Applicant: Pulsedeon Oy, Tampere (FI)

(72) Inventors: Jari Liimatainen, Oulu (FI); Ville Kekkonen, Jyväskylä (FI)

(73) Assignee: Pulsedeon Oy, Tampere (FI)

( * ) Notice: Subject to any disclaimer, the term of this patent is extended or adjusted under 35 U.S.C. 154(b) by 30 days.

(21) Appl. No.: 15/533,069

(22) PCT Filed: Dec. 4, 2015

(86) PCT No.: PCT/FI2015/050854
§ 371 (c)(1),
(2) Date: Jun. 5, 2017

(87) PCT Pub. No.: WO2016/087718
PCT Pub. Date: Jun. 9, 2016

(65) Prior Publication Data
US 2017/0342544 A1    Nov. 30, 2017

(30) Foreign Application Priority Data

Dec. 5, 2014    (FI) ........................... 20146071

(51) Int. Cl.
*C23C 14/28*    (2006.01)
*H01M 2/14*    (2006.01)
(Continued)

(52) U.S. Cl.
CPC ............ *C23C 14/28* (2013.01); *C23C 14/562* (2013.01); *H01M 2/145* (2013.01);
(Continued)

(58) Field of Classification Search
CPC ............................ C23C 14/28; H01M 4/0471
See application file for complete search history.

(56) References Cited

U.S. PATENT DOCUMENTS

| 2004/0106037 A1 | 6/2004 | Cho et al. |
| 2007/0099332 A1 | 5/2007 | Kardokus et al. |
| (Continued) | | |

FOREIGN PATENT DOCUMENTS

| CN | 1794495 A | 6/2006 |
| EP | 0852266 | * 7/1998 |
| (Continued) | | |

OTHER PUBLICATIONS

Finnish Patent and Registration Office, Search Report issued on FI20146071, dated Jun. 23, 2015.
(Continued)

*Primary Examiner* — Joseph A Miller, Jr.
(74) *Attorney, Agent, or Firm* — Berggren LLP (57) ABSTRACT

The present invention presents a method for manufacturing tight and porous coatings from metallic, ceramic and organic materials by utilizing composite targets manufactured of two or several materials, which are disintegrated, and producing in this way material flow towards the object to be coated by utilizing short laser pulses directed to the target material. With the method it is possible to produce material structures in a controlled manner, minimizing the needed energy of the laser pulses and heat generation, and with the method it is also possible to improve productivity by correctly choosing the components for the target material.

14 Claims, 4 Drawing Sheets

(51) Int. Cl.
*C23C 14/56* (2006.01)
*H01M 4/04* (2006.01)
*H01M 10/0525* (2010.01)
*H01M 10/052* (2010.01)
*H01M 4/02* (2006.01)

(52) U.S. Cl.
CPC ....... *H01M 4/0402* (2013.01); *H01M 4/0423* (2013.01); *H01M 4/0471* (2013.01); *H01M 10/0525* (2013.01); *H01M 10/052* (2013.01); *H01M 2004/028* (2013.01)

(56) References Cited

U.S. PATENT DOCUMENTS

| | | | |
|---|---|---|---|
| 2008/0175988 A1* | 7/2008 | Chiu | C03C 17/22 427/163.2 |
| 2009/0012523 A1* | 1/2009 | Ruuttu | A61F 2/30767 606/76 |
| 2011/0097550 A1 | 4/2011 | Matusovsky et al. | |

FOREIGN PATENT DOCUMENTS

| | | |
|---|---|---|
| JP | H1192922 A | 4/1999 |
| WO | 2012027587 A2 | 3/2012 |

OTHER PUBLICATIONS

Yamamoto et al., "The relation between surface plasmon resonance and morphology of Ag nanodots prepared by pulsed laser deposition", Solid State Ionics, Feb. 2004, vol. 172, pp. 299-302.

Zhou et al., "Electrochemical reactivity of nanocomposite ZnO—Se for lithium-ion batteries", Electrochimica Acta, Nov. 2011, vol. 59, pp. 345-440.

György, E., et al., Tunable optical and nano-scale electrical properties of WO3 and Ag—WO3 nanocomposite thin Films, Journal of Materials Science, vol. 46, No. 10, Jan. 29, 2011, pp. 3560-3567.

Z.G., Lu, et al., Pulsed laser deposition and electrochemical characterization of LiFePO4—Ag composite thin films, Advanced Functional Materials, vol. 17, No. 18, Nov. 28, 2007, pp. 3885-3896.

Search Report From European Patent Office, 15865535.7-1103 / 3227469 PCT/FI2015050854, dated Jul. 5, 2018.

* cited by examiner

METHOD FOR MANUFACTURING THIN FILMS BY UTILIZING SHORT LASER PULSES AND COMPOSITE TARGET MATERIALS

PRIORITY

This application is a U.S. national application of PCT-application PCT/FI2015/050854 filed on Dec. 4, 2015 and claiming priority of Finnish national application number FI 20146071 filed on Dec. 5, 2014, the contents of all of which are incorporated herein by reference.

FIELD OF THE INVENTION

The invention relates especially to the manufacture of porous coatings by utilizing a target material made of at least two different materials, in which the atomization and/or disintegration of materials of the target material into particles occurs with different energy density ($J/cm^2$) values, leading to a non-homogeneous dispersion of the material so that one material component disperses most advantageously. This leads to a controlled dispersion as the energy generated by laser pulses atomizes the material along the structures formed by the more easily dispersing and/or energy-absorbing material.

BACKGROUND OF THE INVENTION

Manufacturing porous materials for different thin film applications is an application area, which has significance, for example, in sensor coatings, medicine and accumulator technology. In addition to the total amount of porosity, also the control of porosity distribution is critical in the control of porosity. In many coating methods it is challenging to control the uniform quality of both the total amount of porosity, size distribution and porosity distribution, and it would be preferable to design the target material so that the energy generated by laser pulses would disintegrate the material into particles of desired size and shape in a controlled manner.

SUMMARY OF THE INVENTION

The present invention discloses a method for manufacturing porous coating by utilizing laser ablation and a target material made of at least two different materials. In the method of the invention laser pulses are directed to the target material in a controlled manner, the laser pulses causing the first target material (A) to disperse by atomization and as particles earlier than the other target material (B). This mainly atomized material aiming at fast expansion also causes the second material components (B) of the target material to transfer towards the material to be coated. It is not the intention to disintegrate this second material (B) in the ablation, at least not entirely, but the aim is to transfer it as much as possible in the original particle form to the surface of the object to be coated, thus forming a porous coating. The particles of the second material (B) attach to the substrate and to each other. Further, the material atomizing and dispersing from the materials (A) and (B) by means of laser pulses in ablation may form an additional layer of the material between the particles, which enforces the bonds.

In other words, the invention describes a method for manufacturing a thin film type of coating by means of short laser pulses. In the method, a target of a desired shape is manufactured from at least two different target materials by pressing them together by using pressure and/or temperature, in which method the ablation threshold ($J/cm^2$) of the used material component of at least one target material is lower than that of the other target materials used. Short laser pulses are then directed to the target for detaching the target materials and for forming particles with a desired size and material distribution. The material detached from the target is then directed towards the substrate to form a thin film type of coating onto the surface or part of the surface of the substrate.

It is advantageous if the first target material (A) one wishes to disperse by laser pulses is able to absorb the laser pulse energy more efficiently than the other material part (B), which intensifies selective ablation and the controlled dispersion of the material into particles. The share of the first target material (A) can be advantageously selected so that also its energy absorption ability is better or material can be blended with it, which supports energy absorption ability. In an example the ablation threshold of the material (A) and possibly the ablation threshold of some other material components of the target is at least 10 percent lower than the ablation threshold of the other materials of the target. In an example the ability of the target material (A) with a lower ablation threshold to absorb laser energy has been improved by mixing with it at least 0.05 gravimetric percentages of a blend component increasing the absorption ability. In an example the share of the target material (A) with a lower ablation threshold is at least 0.01 volumetric percentages of the entire target, i.e. at least $\frac{1}{10000}$ of the volume of the entire target.

It is essential to choose the components (A) and (B) of the target material to achieve controlled dispersion of the material and, on the other hand, the transfer of the material towards the object or surface to be coated. The size distribution of the target material component (A) dispersing more easily by the impact of laser pulses has to be selected suitably so that the detachment of particles of a desired size from the target material is achieved with appropriate kinetic energy. The detachment mechanism of the laser pulses can be controlled, e.g. by adjusting the length, energy density and wavelength of the laser pulses. It is important to avoid the detachment of too large particles or that the laser pulse would cause the dispersion of all material components of the target material. By selecting the wavelength of the laser pulses it is possible to influence the ability of the different components of the target material to absorb energy and thus to adjust the dispersion of the materials in a correct way. Controlled material dispersion can be intensified by increasing the energy absorption ability of the material (A) desired to be dispersed, for example, by blending.

In an embodiment of the method of the present invention the target material (B) to be detached from the target and used for coating is inorganic material, such as aluminium oxide or silicon oxide, and the target material component (A) principally dispersing first is, for example, organic material or metallic material.

In an embodiment of the method of the present invention the target material (B) to be detached from the target and used for coating is inorganic material, such as aluminium oxide or silicon oxide, and the first material component (A) is material containing carbon and dispersing more easily in laser ablation than the material (B).

The inorganic material used in the previous embodiments can consist of two or even several different inorganic materials, and also other substances than aluminium or silicon oxide can be included in this material.

Inorganic material can comprise at least a half of the volume of the entire target in one embodiment of the invention. In a second embodiment over a half of the volume of the target consists of metallic material. In a third embodiment over a half of the volume of the target consists of polymeric material.

In an embodiment of the method of the present invention the thickness of the thin film type of coating to be produced is at least 50 nm and at most 4000 nm. Likewise, the porosity of the coating can be chosen to be at least 5 volumetric percentages in the embodiment examples of the invention, i.e. at most 95% of the volume defined by the entire coating area, restricted by its outer surface, is attached coating material, and the rest is air, other gas or vacuum, depending on the desired embodiment.

In an embodiment of the method of the invention the inorganic material used for coating is nitride, boride or carbide.

In an embodiment of the method of the present invention the material (B) used for coating is a lithium-alloyed oxide, such as lithium cobalt oxide ($LiCoO_2$), lithium manganese oxide ($LiMn_2O_4$) or lithium iron phosphate ($LiFePO_4$), which can be used as the cathode material for lithium ion accumulators.

In an embodiment of the method of the present invention detaching the material from the target (i.e. vaporization and formation of particles) and transferring the material from the target to the object or surface to be coated is achieved by targeted laser pulses, in which the timely duration of an individual laser pulse is between 0.5 ps-10 ns. In an embodiment of the invention the surface to be coated is a polymer film.

In an embodiment of the method of the present invention laser pulses are generated on repetition frequency, which is between 50 kHz 100 MHz.

In an embodiment of the method of the present invention the polymer film to be coated is polyethylene or polypropylene.

In an embodiment of the method of the present invention the material to be coated is a band of metal, such as an aluminium, copper or steel band.

In an embodiment of the method of the present invention laser ablation and coating occur in a vacuum chamber, vacuum or background gas, and in a controlled pressure of $10^{-8}$-1000 mbar.

In an embodiment of the method of the present invention the inorganic coating material consists of two or several material layers, which are manufactured using at least two different target materials.

DETAILED DESCRIPTION OF THE INVENTION

In the method of the invention there is manufactured a composite target material, in which at least two different materials have been used, the first material (A) being capable to disperse in ablation earlier than the other materials (B) of the target material. The detachment of the material (A) from the target and dispersion can occur, for example, by atomization.

The composite target material can be manufactured with several different processes, such as by blending the different components with each other in a desired relation and by compressing (i.e. "compacting") the blend together to form the target material by means of heat and/or pressure. The source materials of the target can at first be in a powdery form. After compacting, the target material can be entirely or partly condensed. One way to compact the powders is to press the initial powder-form materials cold by unconfined compression or cold isostatic compression into a fixed blank, which is finally sintered to form a tighter and stronger compact target material by means of temperature. If the strength of at least one target material is sufficiently low, the target material can be compressed into a sufficiently tight and strong target material by means of heat and pressure even in one step.

Figure 1:
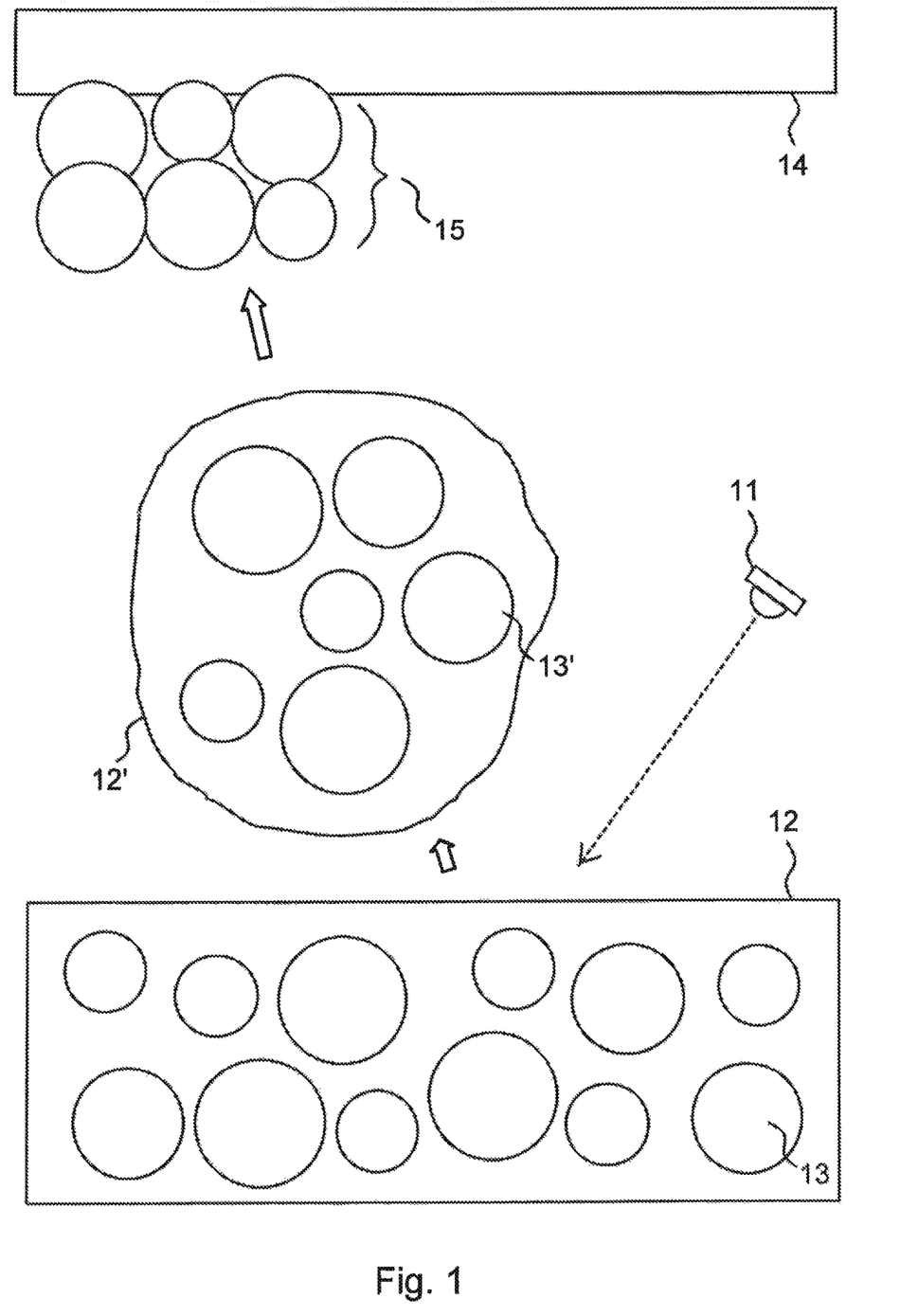
FIG. 1 illustrates the operation principle of the method of the present invention, in which the target has two different materials with different ablation thresholds.

Lowermost in FIG. 1 there is an example of a compressed, i.e. compacted target, in which the material 12 is first target material (A) and the material 13 is material (B) in particle form, which will form at least the main part of the forming coating. The particle material, their size distribution and other parameters relating to the particles can be chosen in a desired way according to the typically used embodiment object.

In order to promote the controlled dispersion it is essential to manufacture the target material so that as the more easily dispersing material (A) disperses, particles of a desired form and size are formed from the material (B), which are directed towards the substrate. This can be impacted by the right blend of the material components (A) and (B) so that paths formed by the more easily dispersing material (A) are created in the compacted material in a desired manner. The more easily dispersing material (A) may form a thin film or layer to the boundary surfaces of the material (B), which can be either continuous or discontinuous.

The components of the target material have to be chosen so that the material flow produced from the materials (A) and (B) as the material (A) disperses is directed from the surface of the target material towards the object to be coated with a sufficient speed, thus ensuring the attachment both to the substrate and reciprocally between the particles. However, the energy of the material flow (containing the particles and the atomized material) must not be too strong, because in case of certain materials it might then damage the material to be coated. Especially in cases, in which the material flow increases the temperature of the substrate as it hits it, the rise in temperature together with the kinetic energy of the material flow can cause damages.

Laser pulses directed to the target material have to be devised so that they separate all material components from the target material in a controlled manner and in a desired form. In some cases it is advantageous to disintegrate only the more easily dispersing material (A) of the two-component target and to minimise the impacts of the laser pulse, such as atomization in the material (B). In this case the objective is that the material (B) forms, for example, a porous material layer to the surface of the substrate and that by choosing material (B) for the target material according to a certain size distribution as it accumulates to the surface of the substrate, also a desired pore distribution is also generated to the coating.

In a second example of the invention the objective is that also the material (B) disperses partly so that it forms together with the more easily dispersing material (A) a layer increasing its strength around the particles (B) and contact surfaces.

The impact depth of the laser pulses, i.e. the depth in which the energy brought by the laser pulses achieves dispersion either in the material (A) or both in the material (A) and (B) simultaneously, is controlled by central parameters, such as the energy, length and wavelength of the laser pulses. If, for example, dispersion of the material (A) occurs too deep, there is the risk that the transfer of the material (B) occurs as too large particles so that the particles in the material (B) are not fully detached from each other.

The laser ablation process is next described referring to FIG. 1. A laser source 11 is needed as the energy source in ablation, the laser source emitting very short laser pulses on a desired repetition frequency. The repetition frequency can be, for example, between 50 kHz-100 MHz. The laser source is placed so that the pulses can be directed to the surface of the compacted target. In FIG. 1 the said arrival angle of the pulses is depicted as arriving obliquely to the surface of the target to be processed, but the angle can be freely chosen to be such that the detached material disperses in the direction of the object to be coated and also in a direction different from the place of the laser source.

In the example of the invention there is formed a material flow, which consists of the particle set 13' comprising the material B and of the atomized material (A) 12' surrounding this. The particles of the material flow can naturally be of many different sizes and shapes. The parameters used in the laser ablation process together with the material properties of the compacted target define the characteristics of the detached particles of the material flow.

The purpose of the process is to make the material flow collide with the surface or object 14 to be coated. Because 12' is atomized more easily detaching material and 13' is particles, 12' works like a transmitter for the particles 13' in the material flow. The final result is a material flux hitting strongly the surface or object 14 to be coated, from which the particles 13' attach tightly to the surface, forming the coating 15. Because of the transmitter A, the coating can be made porous, when so desired, and the amount of porosity can also be adjusted to be on a desired level, i.e. the number of pores per volume unit of the coating and the size distribution and quality of the pores are adjustable as desired by adjusting the parameters of the ablation process and the material composition of the target.

Figure 2:
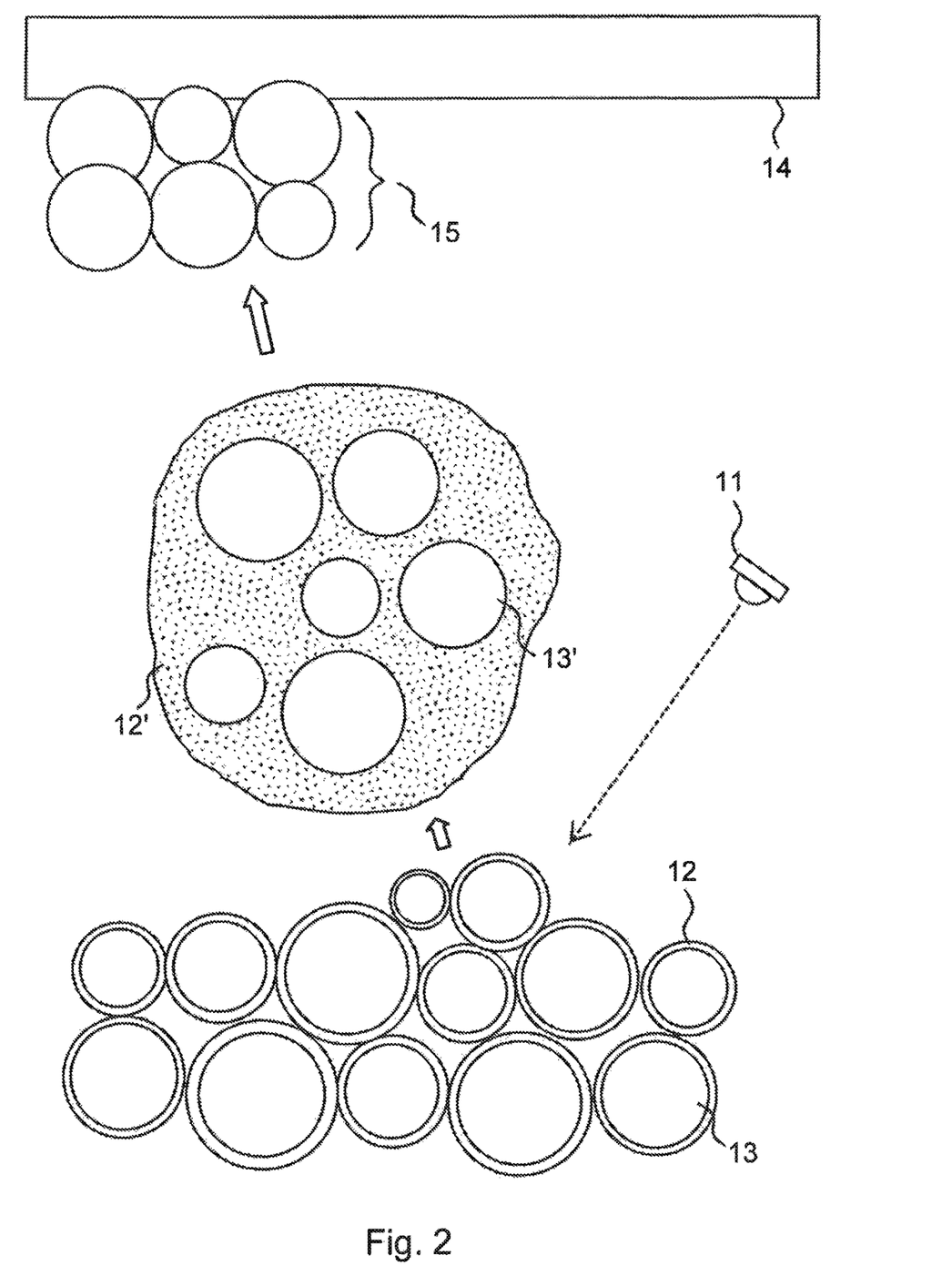
FIG. 2 illustrates an embodiment example of the invention, in which the target is formed of coated particles.

A second embodiment of the invention concerns an alternative way for coating presented in claim 8 by using a different type of target forming, see FIG. 2. In this example the target is built from powdery substances. Thus the powder itself forms the particle set 13. In this embodiment at least one powder type 13 is coated with a metallic, inorganic or organic material 12, corresponding to the material (A) according to the previous notation. The said material (A) coating the particles thus has a lower ablation threshold compared to the ablation threshold of the particles.

The said coated powder or set of powders (in which at least one powder type is coated) can be compacted into a target in high pressure and temperature. The laser ablation process itself can be conducted in the same way as in the embodiment in FIG. 1. In other words, the short laser pulses of the laser source 11 can be transmitted on a desired repetition frequency and directed to the surface of the compacted target in a desired angle of incidence. The detaching material flow is formed so that the more easily ablating material forms a vaporized atomized cloud 12', among which the particles ablating slightly later (without a coating) 13' move. Thus the material flux typically consists of "bubbles" formed by the atomized particle coating material, each bubble having inside them a number of powder particles that have lost their coating material in ablation.

Upon hitting the actual surface 14 to be coated the material flux behaves as above and the particles 13' attach to the surface 14 forming a porous coating 15 on the object or surface 14.

Figure 3:
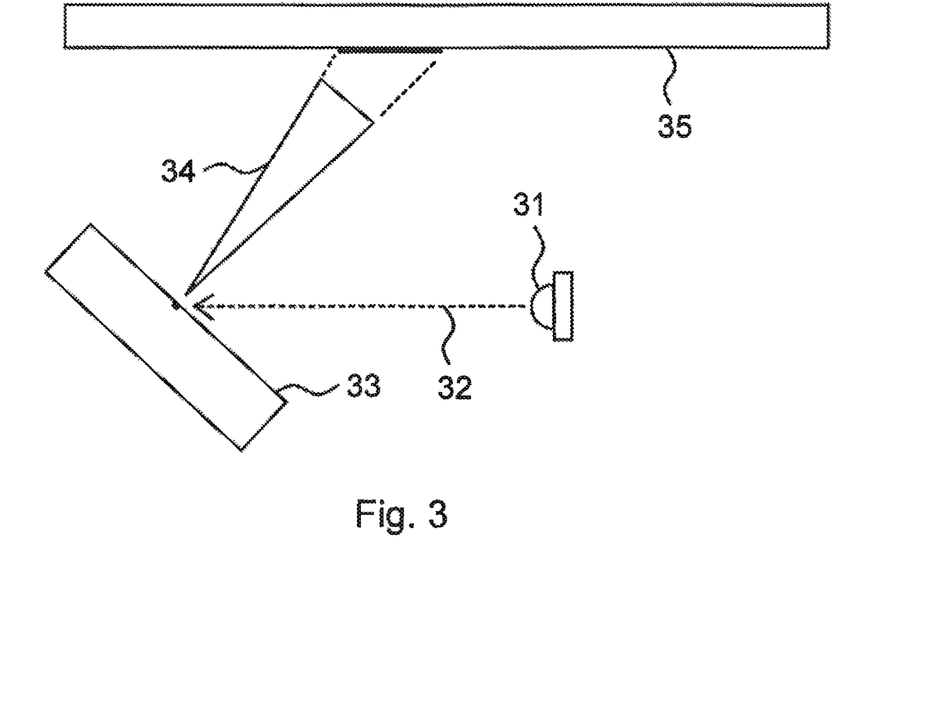
FIG. 3 illustrates the principle of a laser ablation process with different physical components in an example of the invention.

FIG. 3 again presents as a principle view parts used in the laser ablation method of the invention as well as treated material surfaces and directions of travel of the materials. In FIG. 3 the energy source for the ablation process is the laser light source 31, from which laser light is directed as short pulses 32 towards the target material 33. The laser pulses 32 cause local detachment of the material from the target as particles or similar parts on the surface of the target material 33, the particles having been described more closely above. A particle material flow 34 is thus generated, which extends towards the material 35 to be coated. The right orientation can be realized by setting the direction of the plane of the target material surface 33 to be suitably bevelled in relation to the direction of the arriving laser pulses 32 so that the direction of kinetic energy released in the form of plasma is towards the material 35 to be coated. The distance of the laser source 31 to the target 33, or the angle of direction of the laser pulses 32 in relation to the surface of the target 33 can thus be varied, when so desired. In addition, a separate arrangement can be placed between the laser source 31 and target 33, with which the laser pulse front hitting the target 33 can be unilateralized. There is a separate FIG. 5 of this arrangement.

The plasma and particle material flow 34 in FIG. 3 can be fan-shaped so that a larger area can be coated at a time in the area of the surface 35 to be coated by using the selected angle of direction and a certain location of the object to be coated. In a second embodiment the material to be coated can be moved, and there is a separate FIG. 6 of this example.

Figure 4:
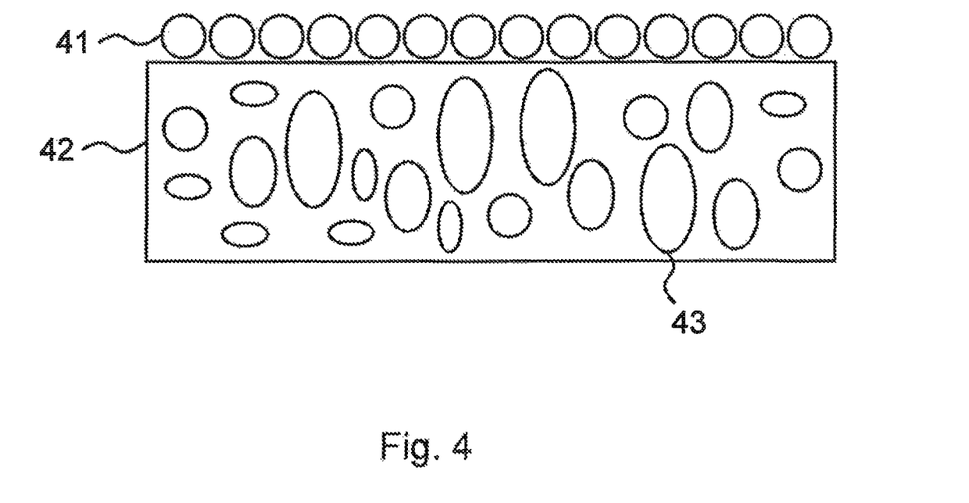
FIG. 4 illustrates an example, in which a porous separator film is coated with the principle of the invention.

FIG. 4 presents an exemplary structural view of the separator film for lithium accumulators functioning as an embodiment of the present invention after the film has been coated using the method of the invention. The separator film 42 used in accumulator applications is typically polymer-based, and it has a microporous structure 43, as has been stated above. The pores 43 of the polymer film can be of variable sizes. Also the coating 41 consisting of inorganic material has a porous structure. The porosity of microporous polymer films in the separator films for lithium accumulators is typically between 30-50 volumetric percentages, and the objective is that the porosity of an inorganic coating would be at least 30 volumetric percentages. It is essential that the porosity of the inorganic material is mainly thorough, which makes possible that the electrolyte is able to moisten the film as well as possible. A porous material is achieved by detaching the material by laser ablation and creating circumstances, in which nanoparticles of typically 10-100 nm or particle clusters formed by these is formed as detached material. As these particles and particle clusters accumulate onto the surface of the polymer film, they form a porous coating. Alternatively, the detachment of material conducted by laser ablation occurs entirely or partly through molten particles or particles detaching from the target material, which form a coating of inorganic material to the surface of the polymer film. The previous mechanism produces a finer particle distribution so that also the pore distribution becomes finer. In practice the coating is often generated by both mechanisms, which is further complemented by the plasma generated as the result of laser ablation. The structure and porosity of the inorganic coating is adjusted by controlling the separation mechanisms of the different materials.

Figure 5:
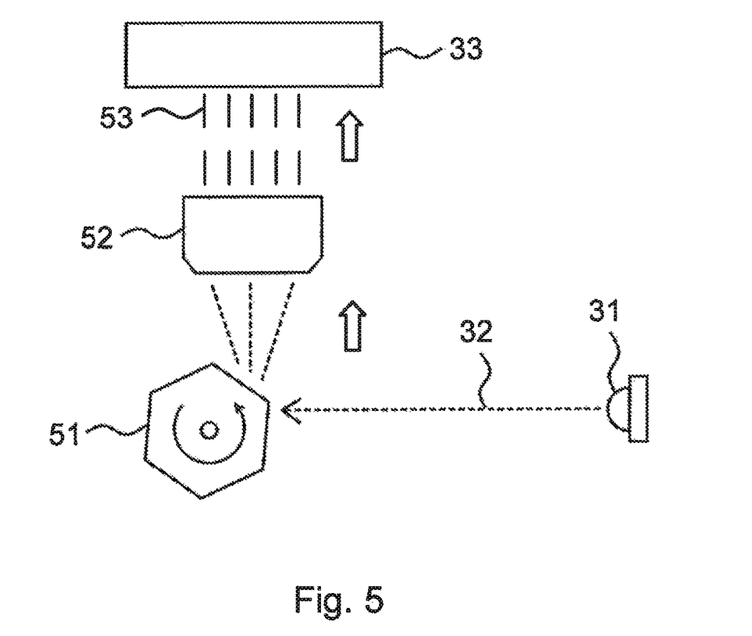
FIG. 5 illustrates the principle of forming a fan-shaped and unilateralized laser pulse front with an apparatus arrangement of the invention.

For improving the uniform quality and productivity of the coating it is advantageous to produce as wide a material flow as possible from the target to the substrate. In an embodiment example of the invention this can be achieved by dispersing the laser pulses into a laser pulse front travelling in the same plane by means of turning mirrors. This arrangement is illustrated in FIG. 5. Instead of the target, the laser pulses 32 of the laser source 31 are here directed to the turning mirrors 51. This kind of mirror structure can be, for example, a hexagonal mirror surface rotatable about its axis. The laser pulses 32 are reflected from the turning mirrors 51 into a fan-shaped laser pulse formation (or laser beam distribution), and the said reflected pulses are directed to the telecentric lens 52. By means of the telecentric lens 52 the laser pulse front can be directed essentially as a parallel laser pulse front 53 so that all laser pulses hit the target material 33 in the same angle for forming the particles. In this example of the figure the said angle is 90°.

Figure 6:
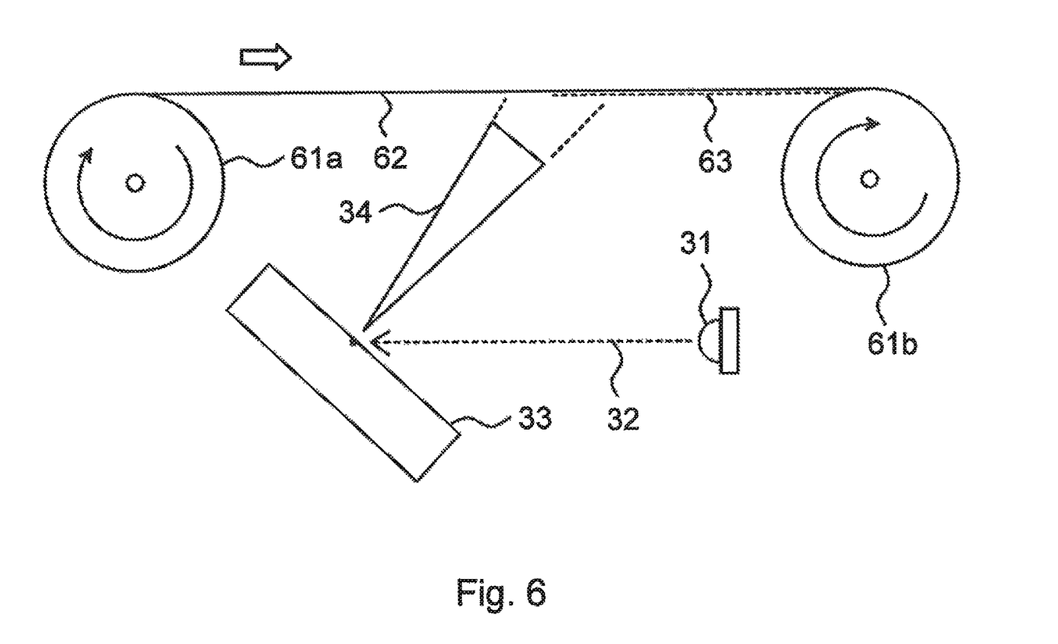
FIG. 6 illustrates an example of a so-called roll-to-roll principle relating to a coating process.

The coating process can be scaled to be more efficient so that the material to be coated, such as a separator film, is set to travel between two rotating rolls or rollers. A basic diagram of such an apparatus arrangement is illustrated in FIG. 6. Ablated material is directed to the desired coating width from one or several coating sources i.e. targets 33 so that material surface 62 to be coated is continuously discharged from the roll 61a to be coated in the processing area of a coating chamber, and after the material has obtained its coating, the material 63 is collected to a second roll 61b for storing. The method can be called a roll-to-roll principle. In other words, the separator film 62 to be coated is originally around the roll 61a. The ablation apparatus with its laser sources 31 and target materials 33 is comprised in the same way as has been described above. The laser pulses 32 make the material to be released as a particle flow 34 (in other words, in the form of a material flux) towards the material 62 to be coated, and as the consequence of adherence the coated polymer film 63 is produced. The coated polymer film 63 is let to rotate around the second roll 61b, the direction of motion of the film being from left to right in the case of FIG. 6. The roll or roller structures 61a, 61b can be controlled by motors. The area to be coated of the separator film can be the entire area of the surface, seen from the direction of depth, or only a part of the depth-oriented measure of the surface at a time. The use of mirror solutions according to FIG. 5 and the reach in the direction of depth of the parallel laser front certainly has a direct impact on how large an area can be coated at one time. Likewise, a desired part (length) of the film can be selected for coating in the direction of motion of the film, or alternatively, the whole roll can be gone through from the beginning to the end so that the entire roll is coated. With the structure of FIG. 6 it is possible to carry out the coating more efficiently and in a way well suited for industrial production.

In addition to the manufacturing method, the inventive idea comprises the coated materials, objects and components achieved as the final result, and the use of the presented manufacturing method, for example, for the coating of porous separator films for lithium accumulators, for the coating of porous cathode materials of lithium accumulators, and for the manufacture of porous coatings for sensors. In principle the object of the invention can be any surface, which is needed to be coated with a high quality coating i.e. thin film, for example, relating to the protection of a material or to the improvement or change of a certain physical characteristic. The final result is then the generation of a coated product fulfilling desired physical or electric characteristics or conditions of desired strength or porosity.

In other words, the inventive idea of the invention also comprises the object or surface coated with a thin film type of coating obtained as the result of an ablation method. This coating is produced from a compacted target by laser ablation, and the target comprises at least two different target materials. A characteristic feature of the product and also of the method is that the ablation threshold of at least one target material used (i.e. one material component used in the target) is lower i.e. smaller than the ablation threshold of the other target materials in the target. In addition, the material with the higher ablation threshold forms the main part of the produced coating in the final product, and the generated coating has a porous structure.

The method of the invention has the following advantages:
  i. Porous coatings can be manufactured with a desired pore distribution by choosing particles of suitable sizes (or with a suitable size distribution) and shapes for the manufacture of target materials and by using the material selections to create conditions for the controlled dispersion of the material by the impact of energy generated by the laser pulses.
  ii. The amount of laser power needed can be decreased by choosing a more easily dispersing material, when needed.
  iii. Thermal stress can be reduced, because the amount of laser power can be decreased in accordance with item ii.
  iv. Production efficiency can be increased, because laser ablation has the need to disintegrate only a small part of the target material, the dispersion threshold of which can be reduced e.g. by blending.
  v. Because the material disperses selectively, the composition of the coating can be maintained stable in a controlled manner, if there occurs no significant dispersion of the material component which is essential for the functionality.

In the invention it is possible to combine the said individual features of the invention disclosed above and in the dependent claims into new combinations, in which two or more individual features can be comprised in a same embodiment.

The present invention is not only restricted to the presented examples, but many variations are possible within the scope of protection defined by the enclosed claims.

The invention claimed is:

1. A method for manufacturing a thin film type of coating by means of laser pulses, said method comprising the steps of:
   providing a coated powder, formed of at least a first and a second material, wherein the first material is metallic, inorganic or organic material, and the second material is a powdery substance, and the ablation threshold (J/cm$^2$) of the first material is lower than the ablation threshold of the second material, and the first material forms a coating on the second material particles;

manufacturing a target of a desired shape from the coated powder by means of pressure and/or temperature by compressing;

directing laser pulses to the target for detaching the target materials and for forming particles with a desired size and material distribution, wherein the duration of an individual laser pulse is less than 10 ns; and directing the materials detached from the target towards a substrate to form a coating on the surface or part of the surface of the substrate.

2. The method according to claim 1, wherein the ablation threshold ($J/cm^2$) of the first material is at least 10% lower than the ablation threshold of the second material or any further target materials used.

3. The method according to claim 1, wherein the ability of the target material with lower ablation threshold to absorb laser energy is increased by blending with it at least 0.05 gravimetric percentages of a blend component.

4. The method according to claim 1, wherein the share of the target material with the lower ablation threshold of the target is at least 0.01 volumetric percentages.

5. The method according to claim 1, wherein at least 50 volumetric percentages of the target are inorganic material.

6. The method according to claim 1, wherein at least 50 volumetric percentages of the target are metallic material.

7. The method according to claim 1, wherein at least 50 volumetric percentages of the target are polymer material.

8. The method according to claim 1, wherein porous the coating formed on the surface of the substrate has a porosity of at least 5 volumetric percentages.

9. The method according to claim 1, wherein the laser pulses are directed to turning mirrors, in which there is formed a fan-shaped laser beam distribution, which is directed to a telecentric lens, the lens being used for forming an essentially parallel laser pulse front, which front is further directed to the target for forming particles.

10. The method according to claim 1, wherein the laser ablation and coating occur in a vacuum chamber, vacuum or background gas and in a controlled pressure of $10^{-8}$-1000 mbar.

11. The method according to claim 5, wherein the inorganic material is aluminium oxide, silicon oxide or it consists of several different inorganic materials.

12. The method according to claim 1, wherein the substrate is a polymer-based film.

13. The method according to claim 1, wherein the target comprises a lithium-alloyed oxide suitable for cathode material for lithium ion accumulators.

14. The method according to claim 1, wherein the target is manufactured by compressing the coated powder cold by unconfined compression or cold isostatic compression into a fixed blank, and sintering the fixed blank by means of temperature.

* * * * *

UNITED STATES PATENT AND TRADEMARK OFFICE
CERTIFICATE OF CORRECTION

PATENT NO. : 10,557,193 B2
APPLICATION NO. : 15/533069
DATED : February 11, 2020
INVENTOR(S) : Jari Liimatainen and Ville Kekkonen It is certified that error appears in the above-identified patent and that said Letters Patent is hereby corrected as shown below:

In the Claims

The preamble of Claim 1 should read:
"A method for manufacturing a coating by means of laser pulses, said method comprising the steps of:"

Claim 8 should read:
"The method according to claim 1, wherein the porous coating formed on the surface of the substrate has a porosity of at least 5 volumetric percentages."

Signed and Sealed this
Seventeenth Day of March, 2020

Andrei Iancu
*Director of the United States Patent and Trademark Office*